US011816400B2

(12) United States Patent
Nam et al.

(10) Patent No.: US 11,816,400 B2
(45) Date of Patent: Nov. 14, 2023

(54) OPTIMAL FAULT-TOLERANT IMPLEMENTATIONS OF HEISENBERG INTERACTIONS AND CONTROLLED-$Z^a$ GATES

(71) Applicant: IonQ, Inc., College Park, MD (US)

(72) Inventors: Yunseong Nam, North Bethesda, MD (US); Dmitri Maslov, Falls Church, VA (US)

(73) Assignee: IonQ, Inc., College Park, MD (US)

( * ) Notice: Subject to any disclaimer, the term of this patent is extended or adjusted under 35 U.S.C. 154(b) by 1220 days.

(21) Appl. No.: 16/275,030

(22) Filed: Feb. 13, 2019

(65) Prior Publication Data
US 2019/0258757 A1   Aug. 22, 2019

Related U.S. Application Data

(60) Provisional application No. 62/632,767, filed on Feb. 20, 2018.

(51) Int. Cl.
| | |
|---|---|
| *G06F 30/20* | (2020.01) |
| *G06N 10/00* | (2022.01) |
| *G06F 11/00* | (2006.01) |
| *G06N 10/60* | (2022.01) |
| *G06N 10/40* | (2022.01) |

(52) U.S. Cl.
CPC ............ *G06F 30/20* (2020.01); *G06F 11/004* (2013.01); *G06N 10/00* (2019.01); *G06N 10/60* (2022.01); *G06N 10/40* (2022.01)

(58) Field of Classification Search
CPC ....... G06F 11/004; G06F 30/20; G06N 10/00; G06N 10/40; G06N 10/60
See application file for complete search history.

(56) References Cited

PUBLICATIONS

Vatan et al. ("Optimal quantum circuits for general two-qubit gates", Physical Review A 69, 032315, 2004, pp. 1-5) (Year: 2004).*
Mohseni et al. ("Fault-Tolerant Quantum Computation via Exchange Itneractions", Physical Review Letters, 94, 040507, 2005, pp. 1-4) (Year: 2005).*

(Continued)

*Primary Examiner* — Miranda M Huang
*Assistant Examiner* — Robert Lewis Kulp
(74) *Attorney, Agent, or Firm* — ARENTFOX SCHIFF LLP

(57) ABSTRACT

The disclosure describes various aspects of techniques for optimal fault-tolerant implementations of controlled-$Z^a$ gates and Heisenberg interactions. Improvements in the implementation of the controlled-$Z^a$ gate can be made by using a clean ancilla and in-circuit measurement. Various examples are described that depend on whether the implementation is with or without measurement and feedforward. The implementation of the Heisenberg interaction can leverage the improved controlled-$Z^a$ gate implementation. These implementations can cut down significantly the implementation costs associated with fault-tolerant quantum computing systems.

25 Claims, 10 Drawing Sheets

(56) References Cited

PUBLICATIONS

Tserkovnyak et al. ("Universal quantum computation with ordered spin-chain networks", Physical Review A, 84, 032333, 2011, pp. 1-8) (Year: 2011).*
Jones et al. ("Simulating chemistry efficiently on fault-tolerant quantum computers", https://arxiv.org/abs/1204.0567, arXiv: 1204.0567v1 [quant-ph], Apr. 3, 2012, pp. 1-38) (Year: 2012).*
Jones et al. ("Novel constructions for the fault-tolerant Toffoli gate", https://arxiv.org/abs/1212.5069, arXiv:1212.5069v1 [quant-ph], Dec. 20, 2012, pp. 1-5) (Year: 2012).*
Terhal et al. ("Novel constructions for the fault-tolerant Toffoli gate", https://arxiv.org/abs/1212.5069, arXiv:1212.5069v1 [quant-ph], Dec. 20, 2012, pp. 1-5) (Year: 2012).*
Bauer et al. ("Analyzing Many-Body Localization with a Quantum Computer", Physical Review X, 4, 041021, 2014, pp. 1-11) (Year: 2014).*
Dmitri Maslov ("Advantages of using relative-phase Toffoli gates with an application to multiple control Toffoli optimization", Physical Review A, 93, 022311, 2016, pp. 1-12) (Year: 2016).*
2. Nathan Cody Jones ("Logic Synthesis for Fault-Tolerant Quantum Computers", Dissertation, Department of Electrical Engineering, Stanford University, Jul. 2013, pp. 1-189) (Year: 2013).*
Inlek, I.V., et al., "Multispecies Trapped-Ion Node for Quantum Networking", American Physical Society, Physical Review Letters, Jun. 23, 2017, pp. 2505021-2505025.

* cited by examiner

OPTIMAL FAULT-TOLERANT IMPLEMENTATIONS OF HEISENBERG INTERACTIONS AND CONTROLLED-$Z^a$ GATES

CROSS REFERENCE TO RELATED APPLICATIONS

The present application claims priority to and the benefit of U.S. Provisional Patent Application No. 62/632,767, entitled "OPTIMAL FAULT-TOLERANT IMPLEMENTATIONS OF HEISENBERG INTERACTIONS AND CONTROLLED-$Z^a$ GATES," and filed on Feb. 20, 2018, the contents of which are incorporated herein by reference in their entirety.

BACKGROUND OF THE DISCLOSURE

Aspects of the present disclosure generally relate to quantum gates, and more specifically, to techniques for optimizing the implementation of quantum gates in fault-tolerant quantum computing systems.

Trapped atomic ions and superconducting circuits are two examples of quantum information processing (QIP) approaches that have delivered universal and fully programmable machines. In these types of quantum information processing or quantum computing systems, it is important to protect the quantum information from errors that may result from, for example, decoherence and other quantum noise. As such, fault-tolerant quantum computing systems employ quantum error correction techniques to deal not only with the noise that may exist in the quantum information, but also with faults in the quantum gates, the quantum state preparation, and the measurements in the systems.

A controlled-$Z^a$ gate (that is, a gate that provides a Z rotation with arbitrary parameter a) is a type of quantum gate that is widely used in quantum computing. For example, the controlled-$Z^a$ gate is used in a versatile quantum algorithmic subroutine called the quantum Fourier transform (QFT). The implementation of the controlled-$Z^a$ gate in fault-tolerant quantum computing systems, however, may be quite expensive in terms of different types of resources (including physical resources, operating time). In addition, the so-called Heisenberg interaction, which may be used in digital-level quantum simulations, may also be quite expensive to implement. As such, it may be desirable to have more efficient or less costly implementations of the controlled-$Z^a$ gate and the Heisenberg interaction for an optimal circuit compilation of quantum algorithms and quantum simulations.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

This disclosure describes improved ways to implement a controlled-$Z^a$ gate using a clean ancilla and an in-circuit measurement. This disclosure also shows an optimized implementation of the Heisenberg interaction that makes use of the improved controlled-$Z^a$ gate implementation. In both instances, the cost of implementing fault-tolerant quantum computations is significantly reduced.

In an aspect, a method for performing a quantum algorithm is described that includes identifying use of a controlled-$Z^a$ gate as part of the quantum algorithm, wherein a is a parameter and a∈[−1, 1]; implementing the controlled-$Z^a$ gate for a fault-tolerant QIP system, wherein the implementation of the controlled-$Z^a$ gate includes multiple elements with only six (6) of the elements being controlled-NOT (CNOT) gates; mapping the implementation of the controlled-$Z^a$ gate into a physical representation in the fault-tolerant QIP system; and performing the quantum algorithm based at least in part on the physical representation.

In another aspect, a different method for performing a quantum algorithm is described that includes identifying use of a controlled-$Z^a$ gate as part of the quantum algorithm, wherein a is a parameter and a∈[−1, 1]; implementing the controlled-$Z^a$ gate for a fault-tolerant QIP system, wherein the implementation of the controlled-$Z^a$ gate includes multiple elements with only four (4) of the elements being T gates, only three (3) of the elements being CNOT gates, and only three (3) of the elements being Hadamard (H) gates; mapping the implementation of the controlled-$Z^a$ gate into a physical representation in the fault-tolerant QIP system; and performing the quantum algorithm based at least in part on the physical representation.

In yet another aspect, a method for performing a quantum simulation is described that includes identifying use of a Heisenberg interaction as part of the quantum simulation; identifying a controlled-$Z^a$ gate for implementing the Heisenberg interaction, wherein a is a parameter and a∈[−1, 1]; implementing the Heisenberg interaction for a fault-tolerant QIP system, wherein the implementation of the Heisenberg interaction is based on an implementation of the controlled-$Z^a$ gate and includes multiple elements with only one (1) of the elements being a parametrized $Z^a$ gate; mapping the implementation of the Heisenberg interaction into a physical representation in the fault-tolerant QIP system; performing the quantum simulation based at least in part on the physical representation; and providing results from the quantum simulation.

Also described herein are apparatuses and computer-readable storage medium for various methods described above associated with optimal fault-tolerant implementations of the Heisenberg interaction and controlled-$Z^a$ gates.

BRIEF DESCRIPTION OF THE DRAWINGS

The appended drawings illustrate only some implementation and are therefore not to be considered limiting of scope.

DETAILED DESCRIPTION

Figure 1:
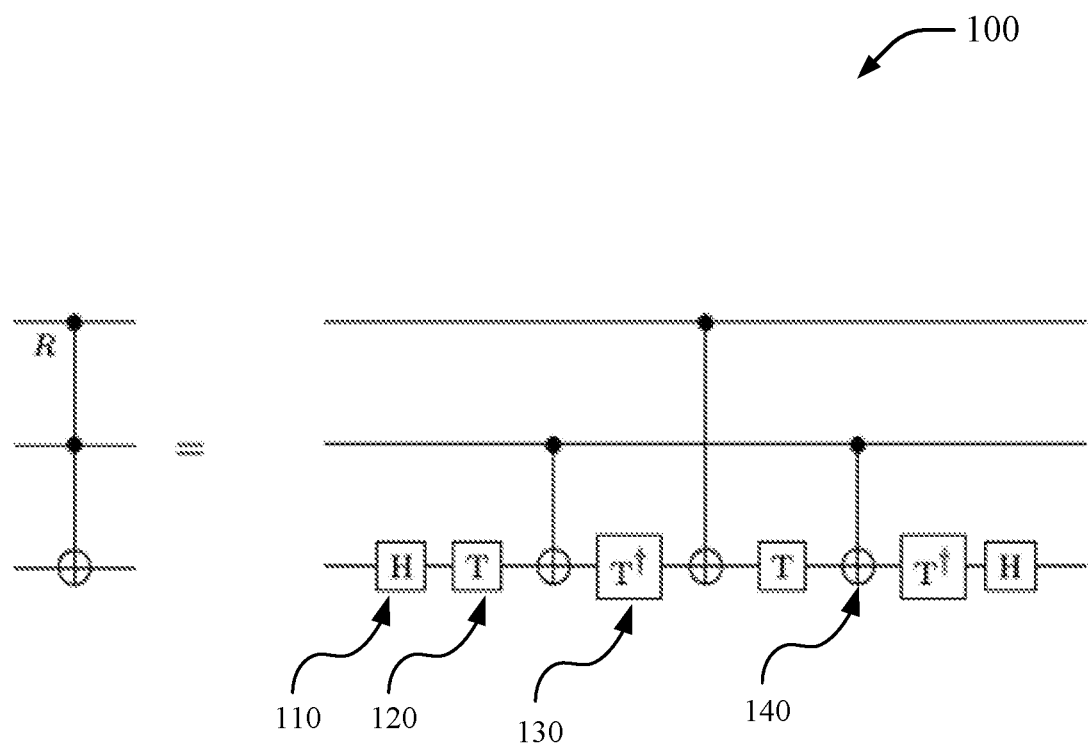
FIG. 1 is a diagram that illustrates an example of a definition of a relative phase (R) Toffoli gate in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

It is to be understood that various aspects of this disclosure relate to fault-tolerant quantum computing systems. In physical quantum computing systems, at the physical level, there are likely to be some errors in quantum computations. Therefore, fault-tolerant quantum computing systems may be used that implement techniques such as performing quantum computations multiple times to identify the ones that are error free and proceed based on those quantum computations. The implementation or mapping of quantum gates or quantum operations (e.g., computing or gate primitives) from a logical expression or level (e.g., encoded logical level gates) to the physical level computing systems come with some costs for fault-tolerant quantum computing systems depending on the type of fault-tolerant protocols used. These costs can include the overall number of physical qubits that are needed and/or the number of operations that need to be performed as part of a computation, in effect the time to complete the computation. For some gates, such as Clifford gates, it is generally known how to implement them over arbitrary physical level quantum computers (being trapped-ion, superconducting, or other type of quantum computes). Such gates as well as other types of gates can be expensive to implement but are generally needed in many important quantum computations. For example, for most fault-tolerant protocols, the implementation of T gates is very costly.

As described above, the controlled-$Z^a$ gate is widely used in quantum computing. For example, the controlled-$Z^a$ gate is used in the QFT. The controlled-$Z^a$ gate is an important computing primitive and is not directly implementable in a fault-tolerant quantum computing system. When implementing the controlled-$Z^a$ gate in fault-tolerant quantum computing systems, however, such implementation may be quite expensive in terms of different types of resources. In addition, the Heisenberg interaction may also be quite expensive to implement. As such, it may be desirable to have more efficient or less costly implementations of the controlled-$Z^a$ gate and the Heisenberg interaction for an optimal circuit compilation of quantum algorithms and quantum simulations.

The present disclosure describes an improved fault-tolerant implementation of the widely used controlled-$Z^a$ gate over Clifford+T library, with or without the availability of in-circuit measurement and feedforward. The present disclosure also shows an optimized fault-tolerant implementation of the so-called Heisenberg interaction. This is accomplished by using a single controlled-$Z^a$ rotation gate to address the real-valued degree of freedom in the Heisenberg interaction, as a whole. In comparison to other implementations, the implementations described in this disclosure can improve the fault-tolerant cost of the controlled-$Z^a$ gate from, for example, eight (8) T gates and one parametrized $Z^a$ gate (described in more detail below) to four (4) T gates and one parametrized $Z^a$ gate. Relying at least partially on these improvements, the fault-tolerant cost of the Heisenberg interaction may also be improved from, for example, three (3) parametrized $Z^a$ gates to one parametrized $Z^a$ gate and four (4) T gates, which is almost a factor of three.

Because the Heisenberg interactions are frequently used in quantum simulations of condensed matter systems and controlled-$Z^a$ gates constitute one of the basic building blocks of the quantum Fourier transform, which is used in the phase estimation and polynomial-time discrete logarithm algorithms for Abelian groups (including the original Shor's integer factoring), the optimization results described in this disclosure may be applicable to a wide range of quantum algorithms.

Since, typically, Clifford gates are less costly to implement and T gates are more expensive to implement in fault-tolerant quantum computing systems, this disclosure focuses primarily on techniques for reducing the count or number of T gates. For a $Z^a$ gate, which is not amenable to direct fault-tolerant implementation, the cost of implementing the $Z^a$ gate may change based on the different ways of approximating it. In fact, known ways to approximate a given (parametrized) $Z^a$ gate to the error e require logarithmically (in $1/\varepsilon$) many T gates, whether the approximation is done optimally using a single qubit over unitary circuits, or by employing additional resources in the form of ancilla (e.g., an ancilla qubit), measurement, and feedforward. Moreover, the quality of the approximation of $Z^a$ need not depend on the value of a (so long as it is not an integer multiple of ¼), but rather on the desired approximation error $\varepsilon$.

Described below are techniques on how to synthesize a fault-tolerant implementation of the controlled-$Z^a$ gate. In particular, the fault-tolerant implementation described herein requires a clean ancilla qubit. Efficient construction of such a gate is needed in realizing, for example, the widely used quantum Fourier transform (QFT), or as it will be described further below, the Heisenberg interaction.

To begin, the parametrized gate $Z^a$, where $a \in [-1, 1]$, and the parametrized gate $R_z(\theta)$, where $\theta \in [0, 2\pi]$, may be defined as described in equation (1):

$$Z^a := \begin{pmatrix} 1 & 0 \\ 0 & e^{i\pi a} \end{pmatrix}, R_z(\theta) := \begin{pmatrix} e^{-i\theta/2} & 0 \\ 0 & e^{i\theta/2} \end{pmatrix}, \quad (1)$$

where $a \in [-1, 1]$ means that the value of a is in the range between −1 and 1, including the end values of the range, that is, −1 and 1, and where θ∈[0, 2π] means that the value of θ is in the range between 0 and 2π, including the end values of the range, that is, 0 and 2π. With such a definition, $Z^1=Z$ (for a=1) is the well-known Pauli-Z gate, $Z^{1/2}=P$ (for a=½) is the Phase gate, $Z^{-1/2}=P^\dagger$ (for a=−½) is the complex conjugate of the Phase gate, $Z^{1/4}=T$ (for a=¼) is the T gate, and $Z^{-1/4}=T^\dagger$ (for a=−¼) is the complex conjugate of the T gate. It is also noted that because of the difference between $Z^a$ and $R_z(\theta)$ by a global phase (for the proper choice of a and θ), fault-tolerant implementations other than the ones discussed herein may apply to the $R_z(\theta)$ gates as well.

In the various techniques described herein, the circuit implementation of the quantum simulation algorithm whose simulation dynamics consists in part of the Heisenberg interaction may be laid out such that quantum gate optimization opportunities are exposed as much as possible. Specifically, the simulation circuit based on a product formula algorithm may lay out the individual Heisenberg interaction terms in alternate orders—forward and reverse—to ensure that a maximum optimization is obtained from the application of a circuit optimizer. This may be performed as part of the pre-preprocessing of the circuit optimizer in the case of any Trotterization-based quantum simulation input. The circuit optimizer may be configured to natively handle controlled-$Z^a$ gates and may apply the merging rule controlled-$Z^a$ controlled-$Z^b$=controlled-$Z^{(a+b)}$. This is a straightforward extension of the functionality of the circuit optimizer to accommodate a controlled version of the $R_z$ gate. Another feature that may be implemented is the merging of two Heisenberg interactions as an optimization rule. This functionality may fit best into the pre-processing of, for example, a circuit optimizer so as to immediately discover and merge two Heisenberg interactions into one before any optimization is done. Yet another feature that may be implemented is the capability of being able to handle classically controlled quantum gates. The classically controlled part of the gate is a pure quantum gate. The classical control may or may not be realized based on in-circuit measurements to be done in an actual instance of quantum computation. As long as these two possible scenarios are compatible with any other part of the circuit optimizer, it is possible to straightforwardly accommodate for classically controlled gates. For example, when considering commutation of two gates to the preceding and following of a classically controlled gate, commutability may be separately checked for the two cases: (i) the pure quantum part is applied, then use the rules that are already built into the circuit optimizer, and (ii) the pure quantum part is not applied, trivially commute things through since no gate is applied.

FIG. 1 shows a diagram 100 that illustrates a definition of a relative phase Toffoli gate (R) used in this disclosure having multiple elements, where H is a Hadamard gate (H 110), T is a T gate (T 120), $T^\dagger$ is the complex conjugate of the T gate ($T^\dagger$ 130), and the symbol ⊕ connecting to a solid (dark) circle corresponds to a CNOT gate or controlled-NOT gate (CNOT 140).

Figure 2:
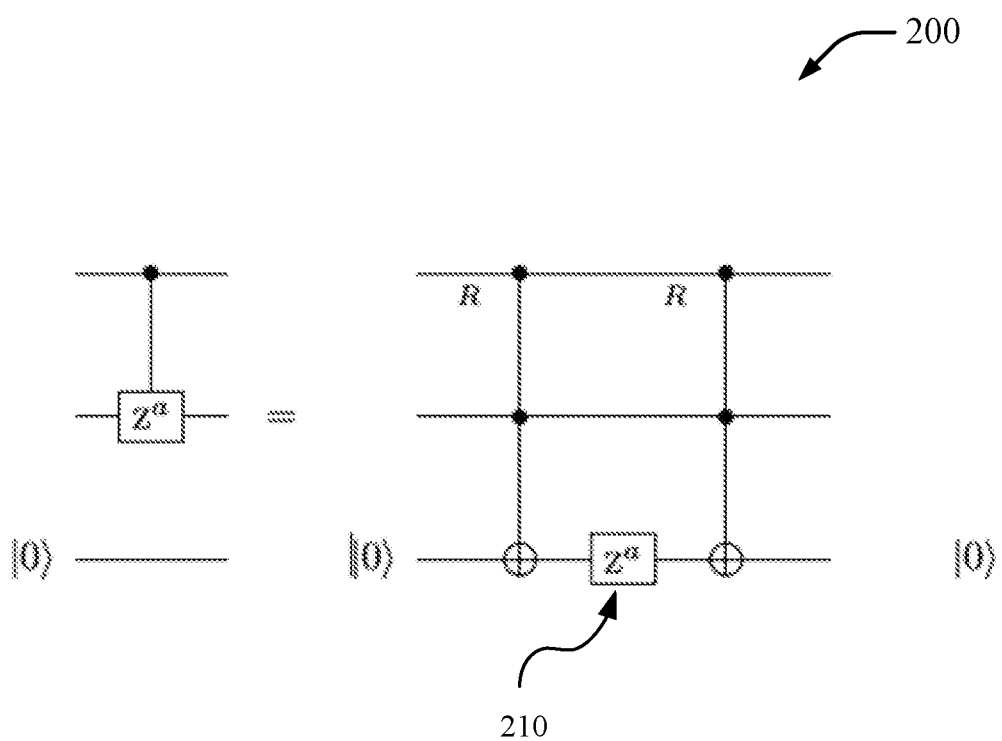
FIG. 2 is a diagram that illustrates an example of an ancilla-aided fault-tolerant controlled-$Z^a$ gate in accordance with aspects of this disclosure.

FIG. 2 shows a diagram 200 that illustrates an ancilla-aided fault-tolerant controlled-$Z^a$ gate having multiple elements. In this implementation, by using one ancilla (e.g., an ancilla qubit), it is possible to obtain a fault-tolerant gate count cost of eight (8) T gates and a $Z^a$ gate ($Z^a$ 210). For example, based on the definition of the relative phase Toffoli gate in FIG. 1, the diagram 200 in FIG. 2 effectively includes one relative phase Toffoli gate (2 T gates and 2 $T^\dagger$ gates) to the left of the $Z^a$ 210 and another relative phase Toffoli gate (2 T gates and 2 $T^\dagger$ gates) to the right of the $Z^a$ 210. Moreover, the ancilla qubit in this example is set to |0).

The implementation shown in FIG. 2 may have the same fault-tolerant gate count as other reported implementations where a middle T gate may be replaced by a $Z^a$ gate. The implementation shown in FIG. 2, however, may use only six (6) CNOT gates (3 for each relative phase Toffoli gate) in contrast to twelve (12) CNOT gates used in these other implementations, and does not use any Phase gates, where these other implementations use two (2) Phase gates. That is, even though the gate count may be the same, the resources needed (e.g., the cost of implementing the gates) is much less in the implementation shown in FIG. 2 compared to other implementations.

Figure 3:
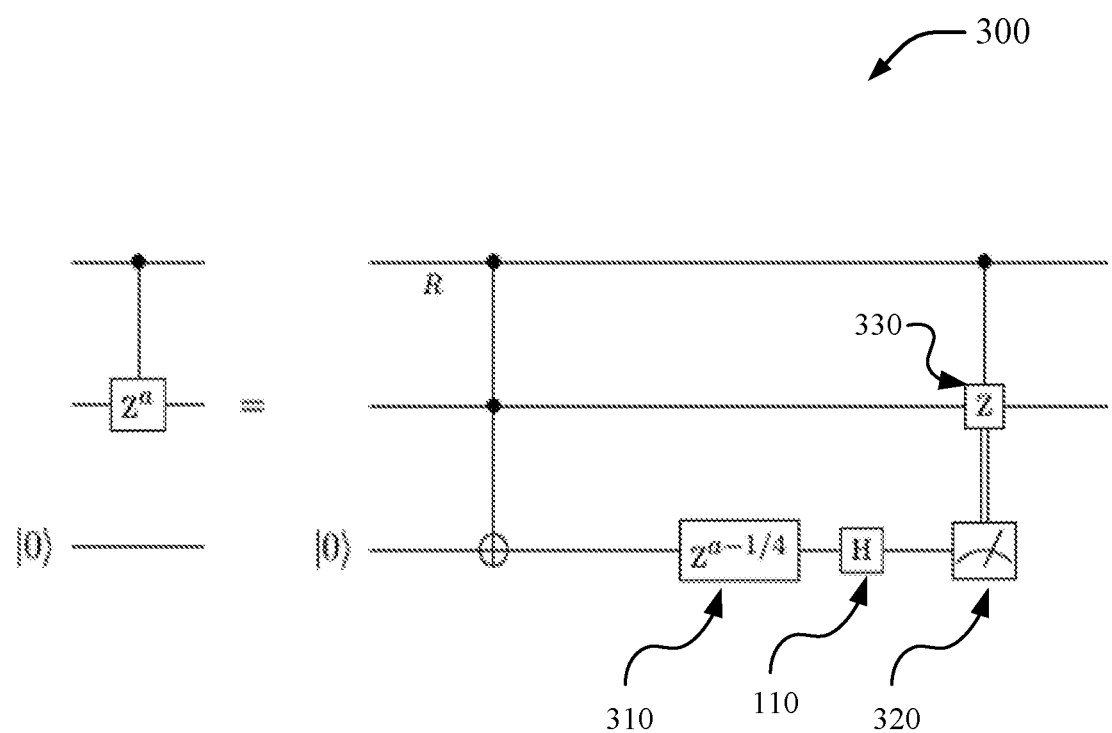
FIG. 3 is a diagram that illustrates an example of an ancilla-aided, in-circuit measurement-based fault-tolerant controlled-$Z^a$ gate in accordance with aspects of this disclosure.

FIG. 3 shows a diagram 300 that illustrates an ancilla-aided, in-circuit measurement-based fault-tolerant controlled-$Z^a$ gate having multiple elements. In this implementation, by using one ancilla (e.g., an ancilla qubit), in-circuit measurement 320, and feedforward (e.g., using a classically-conditioned controlled Pauli-Z gate), it is possible to obtain a fault-tolerant gate count cost of four (4) T gates and an $R_z$ gate. For example, based on the definition of the relative phase Toffoli gate in FIG. 1, the diagram 300 in FIG. 3 effectively includes one relative phase Toffoli gate (2 T gates and 2 $T^\dagger$ gates) to the left of a $Z^{a-1/4}$ gate ($Z^{a-1/4}$ 310), in addition to a Hadamard gate (H 110), the in-circuit measurement 320, and a classically-conditioned controlled-Z gate (Z 330). Moreover, the ancilla qubit in this example is initialized to |0).

The implementation shown in FIG. 3 is based at least in part on combining Kitaev's trick with Toffoli-measurement construction, over an efficient relative phase Toffoli gate, and other circuit simplifications.

In addition to the fault-tolerant implementations of the controlled-$Z^a$ gate described above in connection with FIGS. 1-3, the disclosure also describes aspects of the Heisenberg interaction in quantum simulations. For example, typically in digital-level quantum simulations, a given local Hamiltonian term (an addend of the entire system Hamiltonian) may be projected onto a well-known set of Pauli bases, of which there are $2^k$, where k is the number of qubits that participate in simulating the given local Hamiltonian term. For various reasons, including many body localization phenomena in condensed matter, the so-called Heisenberg interaction plays an important role in such simulations.

A standard or known approach to implement the Heisenberg interaction requires 6 CNOT gates, in addition to three $R_z$ gates. That is, each three two-body interactions $\hat\sigma_x\hat\sigma_x$, $\hat\sigma_y\hat\sigma_y$, and $\hat\sigma_z\hat\sigma_z$ is implemented using one $R_z$ gate and two (2) CNOT gates.

An improved implementation of the Heisenberg interaction is described below. This implementation reduces the pre-fault-tolerant cost to just four (4) CNOT gates, while projecting the real-valued degree of freedom in the Heisenberg interaction onto the controlled-$R_z$ rotation. As such, this proposed implementation is optimal in the real-valued degrees of freedom, and furthermore is well suited for implementation over fault-tolerant quantum computing systems or machine because of mapping of the existing real-valued degree of freedom into that of the single-qubit $Z^a$ gate through application of the controlled-$Z^a$ gate implementations described above in connection with FIGS. 2 and 3.

The Hamiltonian for the Heisenberg interaction between bodies labeled i and j takes the form $\hat{H}_{ij} = \vec\sigma^{(i)} \cdot \vec\sigma^{(j)}$, where $\vec\sigma^{(i)} = (\hat\sigma_x^{(i)}, \hat\sigma_y^{(i)}, \hat\sigma_z^{(i)})^T$. Because this Hamiltonian includes the addition of three Pauli bases, that is, $\hat\sigma_x\hat\sigma_x$, $\hat\sigma_y\hat\sigma_y$, and $\hat\sigma_z\hat\sigma_z$, where the i and j indices are dropped hereinafter for simplicity, the standard Trotter formula approach to simulating such a Hamiltonian on a quantum computer would then require implementations of each of the three Pauli product terms. In an example of the $\hat{\sigma}_z\hat{\sigma}_z$ interaction, the evolution operator reads $e^{-i\hat{\sigma}_z\hat{\sigma}_z\theta}$ and may be implemented as a quantum circuit with some arbitrary parameter as described in a diagram 400 shown in FIG. 4, which includes two (2) CNOT gates (CNOT 140) and an $R_z(2\theta)$ gate ($R_z(2\theta)$ 410).

Figure 4:
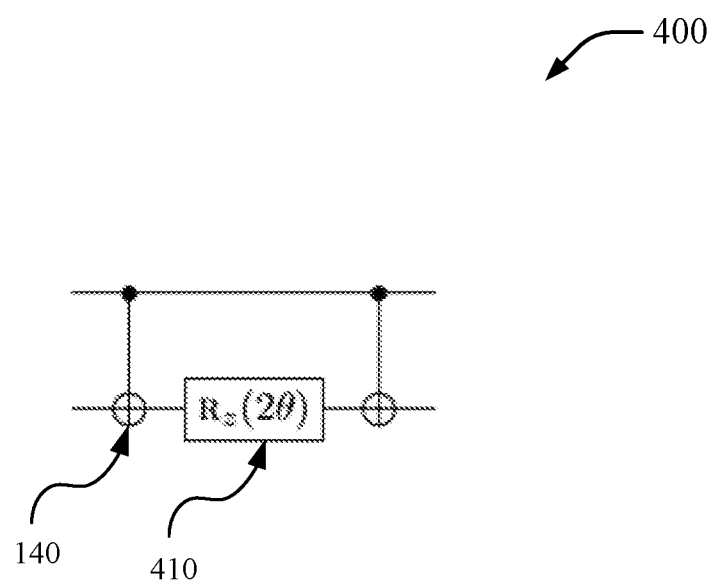
FIG. 4 is a diagram that illustrates an example of a quantum circuit for a two-body interaction with an arbitrary parameter θ in accordance with aspects of this disclosure.

Circuits for the $\hat{\sigma}_x\hat{\sigma}_x$ interaction and the $\hat{\sigma}_y\hat{\sigma}_y$ interaction may be similarly constructed by using the example quantum circuit shown in FIG. 4 and applying a basis change.

Because in general $e^{-i(\hat{X}+\hat{Y})} \neq e^{-i(\hat{X})}e^{-i(\hat{Y})}$ for $\hat{X}$ and $\hat{Y}$ matrices, the Trotterized implementation of $e^{-i\hat{\sigma}_x\hat{\sigma}_x\theta}$ followed by $e^{-i\hat{\sigma}_y\hat{\sigma}_y\theta}$ and $e^{-i\hat{\sigma}_z\hat{\sigma}_z\theta}$ on a quantum computer or quantum computing system is not in general exactly the same as $e^{-i\vec{\sigma}\cdot\vec{\sigma}\theta}$, which is the original local evolution that one targeted to implement.

A Trotter formula-based quantum simulation that includes Heisenberg interactions would therefore suffer from the loss of accuracy in the standard implementation approach because of the approximate nature of the implementation as described above. This means that in order to meet a predetermined error tolerance level of the full simulation, additional quantum computational efforts need be expended. Accordingly, a better quality implementation of the Heisenberg interaction may save the need to expend additional quantum resources since the simulation, and the results from those simulations, would no longer suffer from the loss of accuracy that arises from the poor quality implementation.

To address these issues, this disclosure proposes a different approach to implement the Heisenberg interaction. This implementation is shown in a diagram 500 in FIG. 5 and is represented by the definition described in equation (2) below:

$$\text{Heisenberg}(a) := e^{-i(\hat{\sigma}_x\hat{\sigma}_x + \hat{\sigma}_y\hat{\sigma}_y + \hat{\sigma}_z\hat{\sigma}_z)a} = \begin{pmatrix} e^{-ia} & 0 & 0 & 0 \\ 0 & e^{-ia}\cos(2a) & e^{-i(a-\pi/2)}\sin(2a) & 0 \\ 0 & e^{-i(a-\pi/2)}\sin(2a) & e^{-ia}\cos(2a) & 0 \\ 0 & 0 & 0 & e^{-ia} \end{pmatrix}. \quad (2)$$

Figure 5:
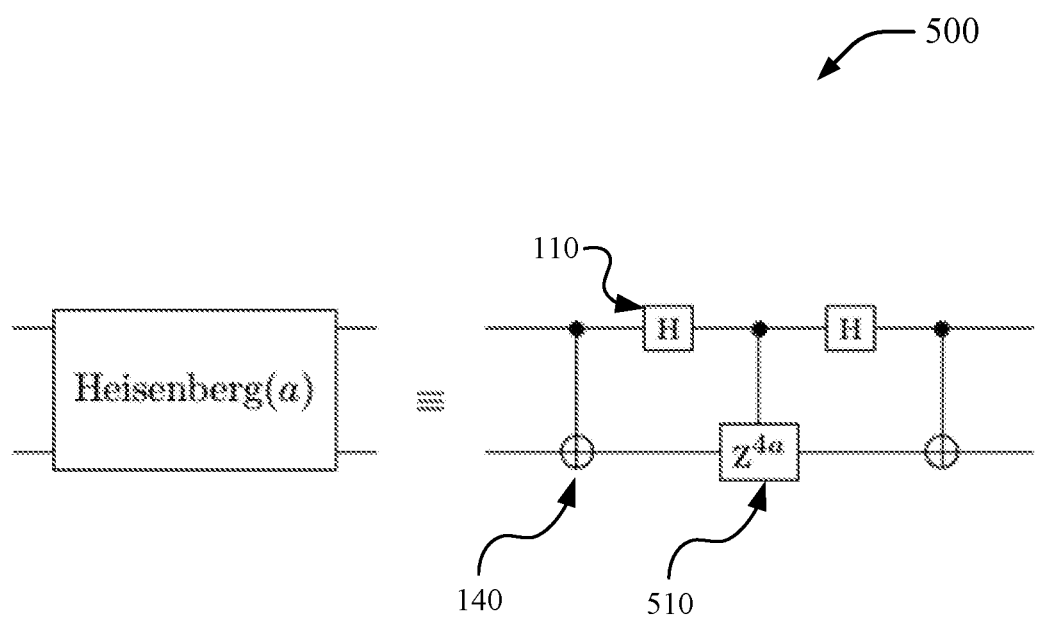
FIG. 5 is a diagram that illustrates an example of an implementation of the Heisenberg interaction optimal in the number of real-valued degrees of freedom up to a global phase on $e^{-ia}$ in accordance with aspects of this disclosure.

This implementation may require a single $Z^a$ rotation, while implementing the Heisenberg interaction exactly, because the controlled-$Z^a$ gate sub-circuit in FIG. 5 ($Z^{4a}$ 510) is implemented as described above in connection with FIGS. 2 and 3. The implementation of the Heisenberg interaction shown in FIG. 5 is optimal in the number of real-valued degrees of freedom, up to a global phase of $e^{-ia}$. As mentioned above, this implementation of the Heisenberg interaction can be made with the controlled-$Z^a$ gates as implemented in FIGS. 2 and 3 depending on whether fault-tolerant implementation with or without measurement and feedforward is preferred. The implementation of the Heisenberg interaction in FIG. 5 also includes two (2) Hadamard gates (H 110) and two (2) CNOT gates (CNOT 140).

Figure 6:
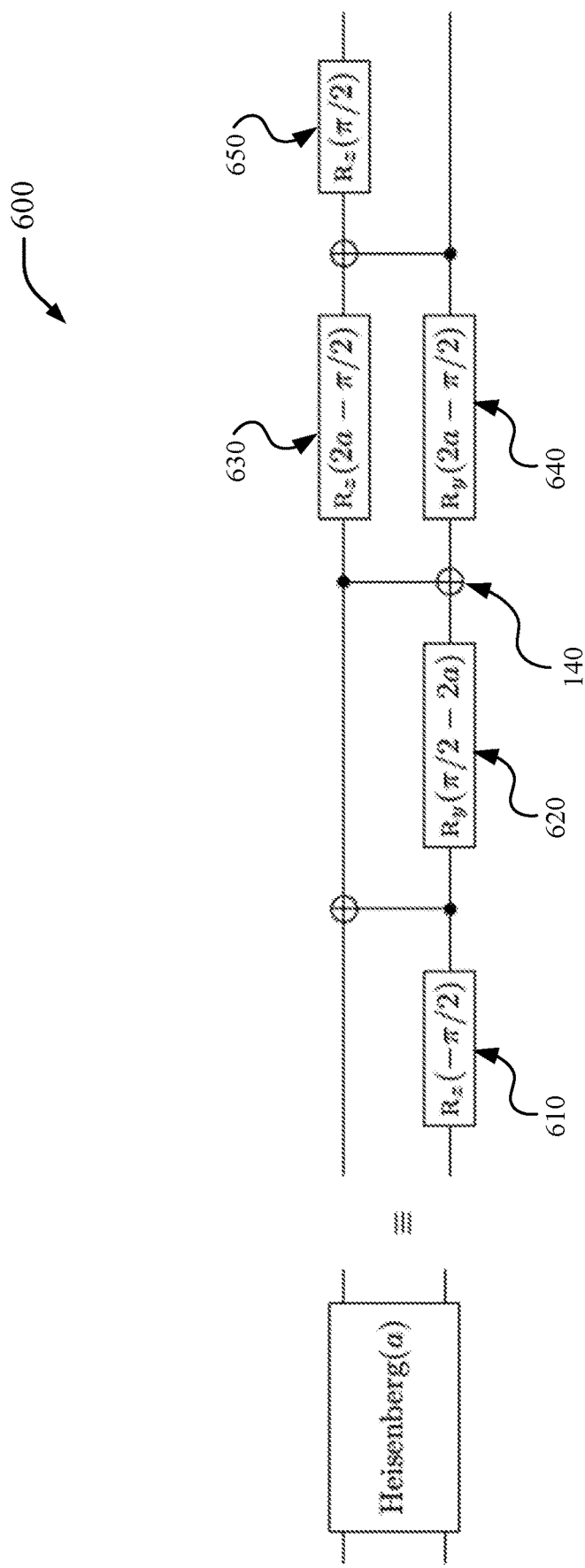
FIG. 6 is a diagram that illustrates an example of the CNOT-count optimal implementation of the Heisenberg interaction up to a global phase on $e^{-i\pi/4}$ in accordance with aspects of this disclosure.

If the focus of the implementation of the Heisenberg interaction is on the pre-fault-tolerant cost, and as such consider the task of minimizing the number of two-qubit interactions (CNOT gates) used in the implementation, then it is possible to implement the Heisenberg interaction using only three (3) CNOT gates. FIG. 6 shows a diagram 600 that illustrates the corresponding circuit implementation of the Heisenberg interaction. This implementation includes three (3) $R_z$ gates (e.g., $R_z(-\pi/2)$ 610, $R_z(2a-\pi/2)$ 630, and $R_z(\pi/2)$ 650) and two (2) $R_y$ gates (e.g., $R_y(\pi/2-2a)$ 620 and $R_y(2a-\pi/2)$ 640).

As described above, the disclosure provides two different implementations of controlled-$Z^a$ gates regardless of the parameter a being used. Moreover, the disclosure provides two different implementations of the Heisenberg interaction, each based on a corresponding controlled-$Z^a$ gate implementation.

For example, a first implementation of the controlled-$Z^a$ gate uses one (1) $Z^a$ gate, eight (8) T gates, six (6) CNOT gates, four (4) Hadamard gates, and one (1) ancilla, as illustrated by expanding the diagram 200 in FIG. 2. The best known implementation of the controlled-$Z^a$ gate relies on one (1) $Z^a$ gate, eight (8) T gates, twelve (12) CNOT gates, four (4) Hadamard gates, two (2) P gates, and one (1) ancilla.

The first implementation of the controlled-$Z^a$ provides a cost reduction over existing implementations. For example, based on costs involving at least a number of physical qubits and/or the number/time involved in performing a computation, a cost of implementing a $Z^a$ gate is approximately 20-50 times a cost of implementing a T gate, and as mentioned above, T gates are expensive gates to implement. A CNOT gate is approximately 50 times less expensive to implement than a T gate. Hadamard gates, ancilla qubits, measurements, and classically-conditioned controlled Pauli-Z gates are not very expensive, each is approximately the cost of implementing a CNOT gate, perhaps even cheaper. In view of this, the cost reduction of the first implementation can be considered to be somewhat small.

In another example, a second implementation of the controlled-$Z^a$ gate (with measurement and feedforward) uses one (1) $Z^a$ gate, four (4) T gates, three (3) CNOT gates, three (3) Hadamard gates, one (1) ancilla, one (1) measurement, and one (1) classically-conditioned controlled Pauli-Z gate, as illustrated by expanding the diagram 300 in FIG. 3. The best known implementation of the controlled-$Z^a$ gate relies on one (1) $Z^a$ gate, eight (8) T gates, twelve (12) CNOT gates, four (4) Hadamard gates, two (2) P gates, and one ancilla. The second implementation of the controlled-$Z^a$ provides a reduction of four (4) T gates over existing implementations, where T gates are expensive to implement.

In another example, a first implementation of the Heisenberg interaction uses one (1) $Z^a$ gate, eight (8) T gates, eight (8) CNOT gates, six (6) Hadamard gates, and one (1) ancilla, as illustrated by expanding the diagram 500 in FIG. 5, where the controlled-$Z^a$ gate is implemented based on the configuration shown in FIG. 2. A standard (non-exact) implementation of the Heisenberg interaction relies on three (3) $Z^a$ gates, six (6) CNOT gates, eight (8) Hadamard gates, two (2) P gates, and two (2) $P^\dagger$ gates. The implementation costs of the first implementation of the Heisenberg interaction are about three (3) times better than the costs associated with the standard implementation because two (2) fewer $Z^a$ gates are needed, and $Z^a$ gates are even more expensive to implement than T gates.

In yet another example, a second implementation of the Heisenberg interaction uses one (1) $Z^a$ gate, four (4) T gates, five (5) CNOT gates, five (5) Hadamard gates, one (1) ancilla, one (1) measurement, and one (1) classically-conditioned controlled Pauli-Z, as illustrated by expanding the diagram 500 in FIG. 5, where the controlled-$Z^a$ gate is implemented based on the configuration shown in FIG. 3. A standard (non-exact) implementation of the Heisenberg interaction relies on three (3) $Z^a$ gates, six (6) CNOT gates, eight (8) Hadamard gates, two (2) P gates, and two (2) $P^\dagger$ gates. The implementation costs of the second implementation of the Heisenberg interaction are about three (3) times better than the costs associated with the standard implementation because two (2) fewer $Z^a$ gates are needed, and $Z^a$ gates are even more expensive to implement than T gates.

Figure 7:
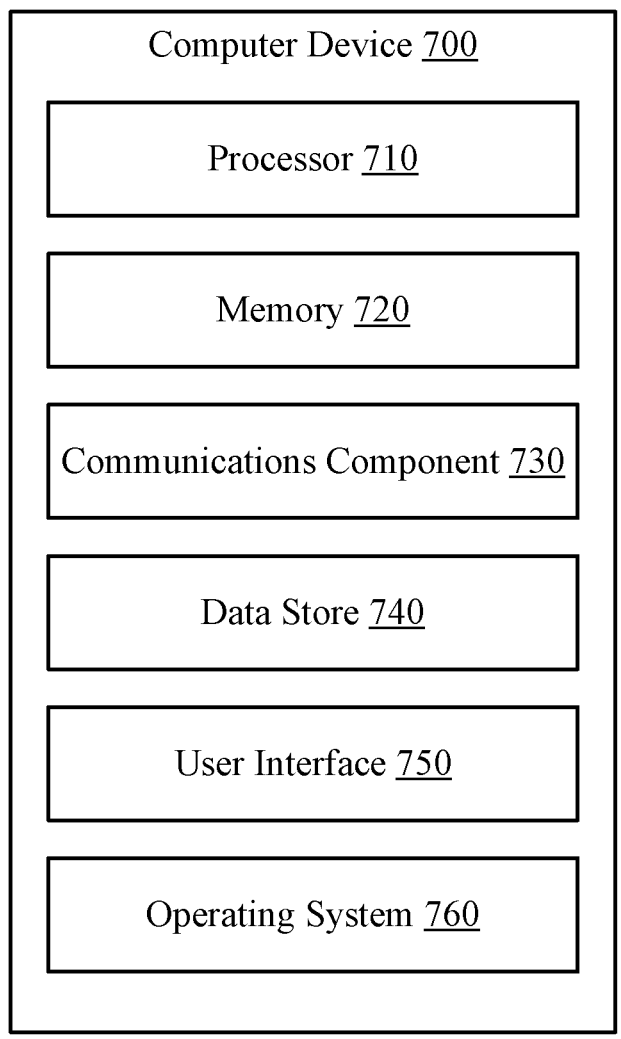
FIG. 7 is a diagram that illustrates an example of a computer device in accordance with aspects of this disclosure.

Referring now to FIG. 7, illustrated is an example computer device 700 in accordance with aspects of the disclosure. The computer device 700 can represent a single computing device, multiple computing devices, or a distributed computing system, for example. The computer device 700 may be configured as a quantum computer, a classical computer, or a combination of quantum and classical computing functions. For example, the computer device 700 may be used to process information to generate or determine the various quantum circuit constructions or implementations described herein that use a controlled-$Z^a$ gate and/or a Heisenberg interaction. Moreover, the computer device 700 may be used as a quantum computer and may implement quantum algorithms and/or quantum simulations based on the quantum circuit constructions or implementations described herein. A generic example of a quantum information processing (QIP) system that can implement and use the quantum circuit constructions or implementations described herein is illustrated in an example shown in FIG. 10.

In one example, the computer device 700 may include a processor 710 for carrying out processing functions associated with one or more of the features described herein. The processor 710 may include a single or multiple set of processors or multi-core processors. Moreover, the processor 710 may be implemented as an integrated processing system and/or a distributed processing system. The processor 710 may include a central processing unit (CPU), a quantum processing unit (QPU), a graphical processing unit (GPU), or combination of those types of processors.

In an example, the computer device 700 may include a memory 720 for storing instructions executable by the processor 710 for carrying out the functions described herein. In an implementation, for example, the memory 720 may correspond to a computer-readable storage medium that stores code or instructions to perform one or more of the functions or operations described herein. In one example, the memory 720 may include instructions to perform aspects of a method 800 and a method 900 described below in connection with FIGS. 8 and 9.

Further, the computer device 700 may include a communications component 730 that provides for establishing and maintaining communications with one or more parties utilizing hardware, software, and services as described herein. The communications component 730 may carry communications between components on the computer device 700, as well as between the computer device 700 and external devices, such as devices located across a communications network and/or devices serially or locally connected to computer device 700. For example, the communications component 730 may include one or more buses, and may further include transmit chain components and receive chain components associated with a transmitter and receiver, respectively, operable for interfacing with external devices.

Additionally, the computer device 700 may include a data store 740, which can be any suitable combination of hardware and/or software, that provides for mass storage of information, databases, and programs employed in connection with implementations described herein. For example, the data store 740 may be a data repository for operating system 760 (e.g., classical OS, or quantum OS). In one implementation, the data store 740 may include the memory 720.

The computer device 700 may also include a user interface component 750 operable to receive inputs from a user of the computer device 700 and further operable to generate outputs for presentation to the user or to provide to a different system (directly or indirectly). The user interface component 750 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 750 may include one or more output devices, including but not limited to a display, a speaker, a haptic feedback mechanism, a printer, any other mechanism capable of presenting an output to a user, or any combination thereof.

In an implementation, the user interface component 750 may transmit and/or receive messages corresponding to the operation of the operating system 760. In addition, the processor 710 may execute the operating system 760 and/or applications or programs (e.g., programs to generate, identify, and use various implementations of the controlled-$Z^a$ gate and/or the Heisenberg interaction), and the memory 720 or the data store 740 may store them.

When the computer device 700 is implemented as part of a cloud-based infrastructure solution, the user interface component 750 may be used to allow a user of the cloud-based infrastructure solution to remotely interact with the computer device 700.

Figure 8:
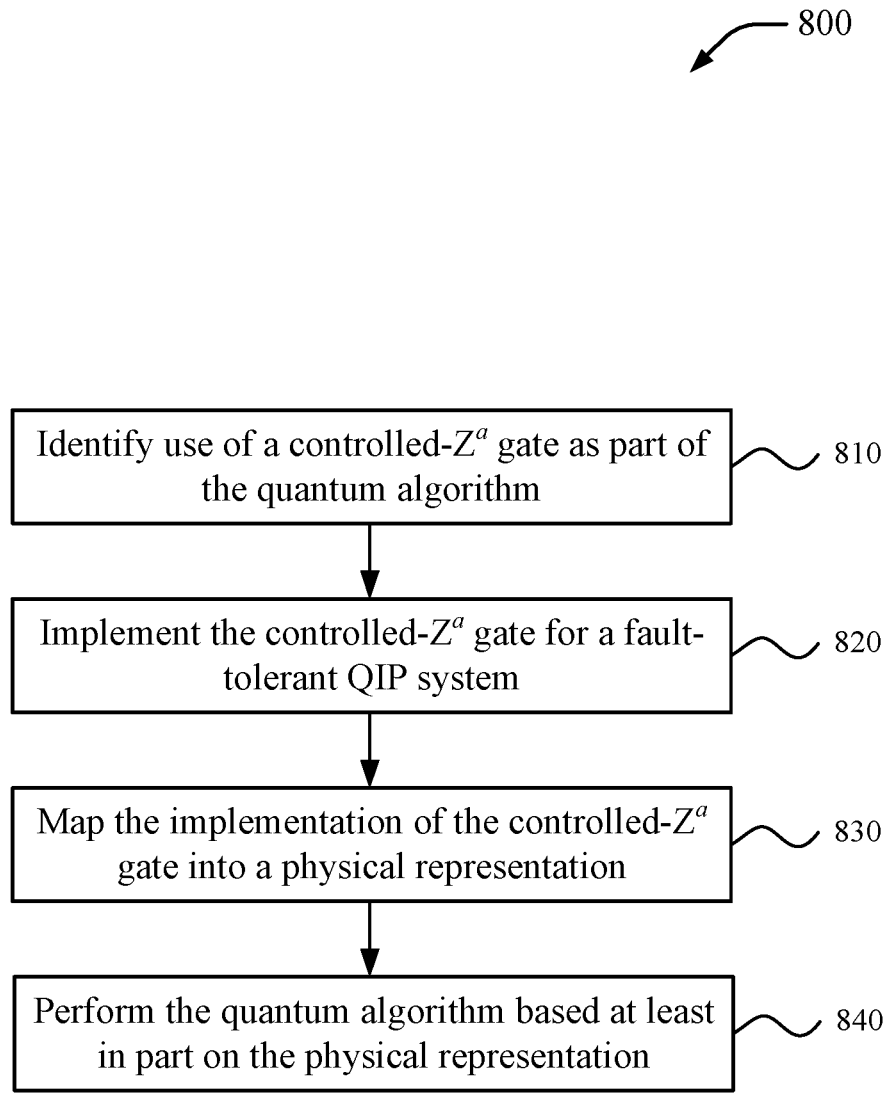
FIG. 8 is a flow diagram that illustrates an example of a method for performing a quantum algorithm in accordance with aspects of this disclosure.

FIG. 8 is a flow diagram that illustrates an example of a method 800 for performing a quantum algorithm in accordance with aspects of this disclosure. In an aspect, the method 800 may be performed in a computer system such as the computer system 700 described above, where, for example, the processor 710, the memory 720, the data store 740, and/or the operating system 760 may be used to perform the functions of the method 800. In another aspect, the method 800 may be performed in a QIP system such as the QIP system 1000 in FIG. 10. The QIP system may be a fault-tolerant QIP system.

At 810, use of a controlled-$Z^a$ gate is identified as part of the quantum algorithm, where a is a parameter and $a \in [-1, 1]$. In some non-limiting examples, the parameter a can take any number of values, including a=1, a=½, a=-½, a=¼, or a=-¼, depending on the gate that is being implemented.

At 820, the controlled-$Z^a$ gate is implemented for the fault-tolerant QIP system.

In a first scenario, the implementation of the controlled-$Z^a$ gate is without or not including measurement and feedforward. In such a scenario, the implementation of the controlled-$Z^a$ gate includes multiple elements with only six (6) of the elements being CNOT gates. The multiple elements of the implementation of the controlled-$Z^a$ gate can further include one (1) parametrized $Z^a$ gate, eight (8) T gates, four (4) Hadamard gates, and one (1) ancilla.

In a second scenario, the implementation of the controlled-$Z^a$ gate is with or including measurement and feedforward. In such a scenario, the implementation of the controlled-$Z^a$ gate includes multiple elements with only four (4) of the elements being T gates, only three (3) of the elements being CNOT gates, and only three (3) of the elements being Hadamard gates. The multiple elements of the implementation of the controlled-$Z^a$ gate can further include one (1) parametrized $Z^a$ gate, one (1) ancilla, one (1) measurement, and one (1) classically-conditioned controlled Pauli-Z gate.

In both the first scenario and the second scenario described above in connection with 820 of the method 800, the controlled-$Z^a$ gate is implemented without using P gates and $P^\dagger$ gates.

At 830, the implementation of the controlled-$Z^a$ gate is mapped into a physical representation in the fault-tolerant QIP system.

In an aspect of the method 800, the fault-tolerant QIP system is a trapped-ion QIP system, and mapping the implementation of the controlled-$Z^a$ gate includes mapping the implementation of the controlled-$Z^a$ gate using multiple trapped-ion-based qubits in the trapped-ion QIP system.

In another aspect of the method 800, the fault-tolerant QIP system is a superconducting QIP system, and mapping the implementation of the controlled-$Z^a$ gate includes mapping the implementation of the controlled-$Z^a$ gate using multiple superconducting-based qubits in the superconductor QIP system.

At 840, the quantum algorithm is performed based at least in part on the physical representation. In an aspect, the quantum algorithm can be a QFT.

Figure 9:
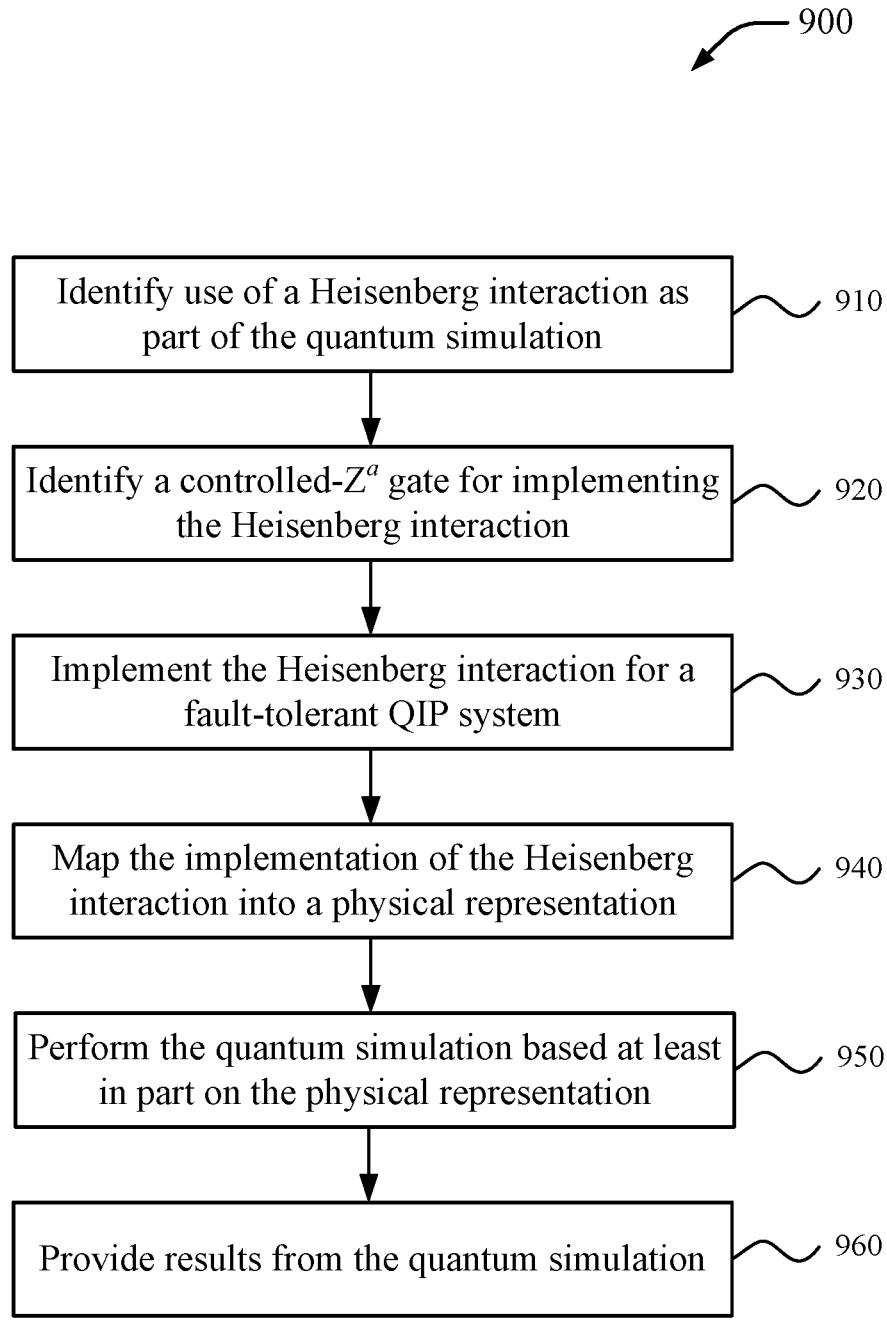
FIG. 9 is a flow diagram that illustrates an example of a method for performing a quantum simulation in accordance with aspects of this disclosure.

FIG. 9 is a flow diagram that illustrates an example of a method for performing a quantum simulation in accordance with aspects of this disclosure. In an aspect, the method 900 may be performed in a computer system such as the computer system 700 described above, where, for example, the processor 710, the memory 720, the data store 740, and/or the operating system 760 may be used to perform the functions of the method 900. In another aspect, the method 900 may be performed in a QIP system such as the QIP system 1000 in FIG. 10. The QIP system may be a fault-tolerant QIP system.

At 910, use of a Heisenberg interaction is identified as part of the quantum simulation.

At 920, a controlled-$Z^a$ gate for implementing the Heisenberg interaction is identified, wherein a is a parameter and $a \in [-1, 1]$. In some non-limiting examples, the parameter a can take any number of values, including a=1, a=½, a=−½, a=¼, or a=−¼, depending on the gate that is being implemented.

At 930, the Heisenberg interaction is implemented for the fault-tolerant QIP system, wherein the implementation of the Heisenberg interaction is based on an implementation of the controlled-$Z^a$ gate and includes multiple elements with only one (1) of the elements being a parametrized $Z^a$ gate.

In a first scenario, the implementation of the Heisenberg interaction includes identifying that the implementation of the controlled-$Z^a$ gate is without measurement and feedforward. In such a scenario, the elements of the implementation of the Heisenberg interaction can further include eight (8) T gates, eight (8) CNOT gates, six (6) Hadamard gates, and one (1) ancilla.

In a second scenario, the implementation of the Heisenberg interaction includes identifying that the implementation of the controlled-$Z^a$ gate is with measurement and feedforward. In such a scenario, the elements of the implementation of the Heisenberg interaction can further include four (4) T gates, five (5) CNOT gates, five (5) Hadamard gates, one (1) ancilla, one (1) measurement, and one (1) classically-conditioned controlled Pauli-Z gate.

In both the first scenario and the second scenario described above in connection with 930 of the method 900, the Heisenberg interaction is implemented without using P gates and $P^\dagger$ gates.

At 940, the implementation of the Heisenberg interaction is mapped into a physical representation in the fault-tolerant QIP system.

In an aspect of the method 900, the fault-tolerant QIP system is a trapped-ion QIP system, and mapping the implementation of the Heisenberg interaction includes mapping the implementation of the Heisenberg interaction using multiple trapped-ion-based qubits in the trapped-ion QIP system.

In another aspect of the method 900, the fault-tolerant QIP system is a superconducting QIP system, and mapping the implementation of the Heisenberg interaction includes mapping the implementation of the Heisenberg interaction using multiple superconducting-based qubits in the superconducting QIP system.

At 950, the quantum simulation is performed based at least in part on the physical representation. In an aspect, the quantum simulation can be a many body localization phenomena simulation.

At 960, the results from the quantum simulation are provided.

In another method for performing a quantum simulation, the method may include identifying use of a Heisenberg interaction as part of the quantum simulation, implementing a pre-fault tolerant implementation of the Heisenberg interaction (see e.g., the diagram 600 in FIG. 6), where the pre-fault tolerant implementation of the Heisenberg interaction includes multiple elements with only three (3) of the elements being CNOT gates, mapping the pre-fault tolerant implementation of the Heisenberg interaction into a physical representation in a QIP system, performing the quantum simulation based at least in part on the physical representation, providing results from the quantum simulation. The multiple elements of the pre-fault tolerant implementation of the Heisenberg interaction further include three (3) $R_z$ gates, and two (2) $R_y$ gates, where the three (3) $R_z$ gates include one (1) $R_z(-\pi/2)$, one (1) $R_z(2a-\pi/2)$, and one (1) $R_z(\pi/2)$, the two (2) $R_y$ gates include (1) $R_y(\pi/2-2a)$ and one (1) $R_y(2a-\pi/2)$, and a is a parameter and a e [−1, 1]. A QIP may be configured for performing this quantum simulation and a computer-readable medium may store code with instructions executable by a processor for performing this quantum simulation.

Figure 10:
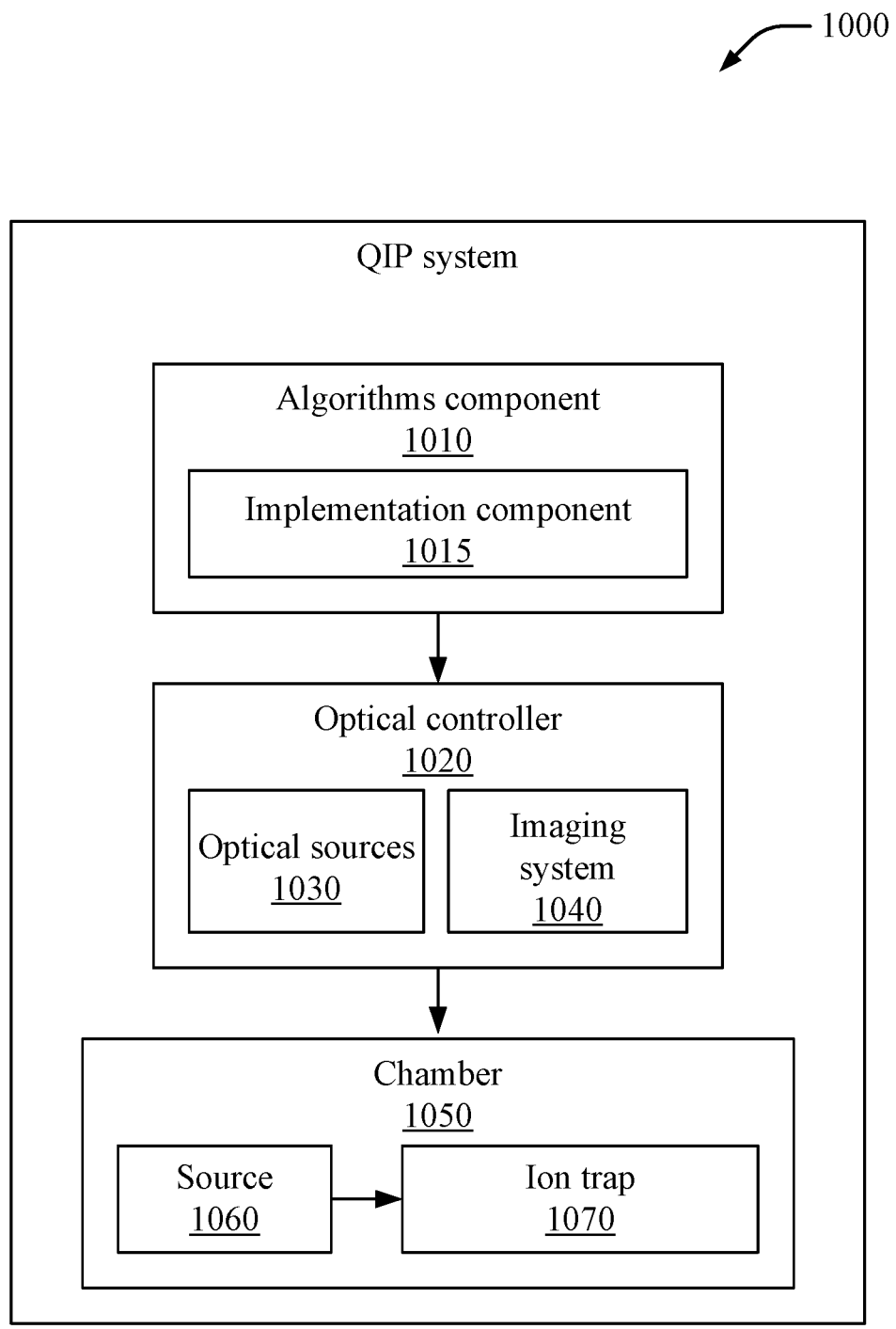
FIG. 10 is a block diagram that illustrates an example of a trapped-ion-based QIP system in accordance with aspects of this disclosure.

FIG. 10 is a block diagram that illustrates an example of a QIP system 1000 in accordance with aspects of this disclosure. The QIP system 1000 may also be referred to as a quantum computing system, a computer device, or the like. In an aspect, the QIP system 1000 may correspond to portions of a quantum computer implementation of the computer device 700 in FIG. 7.

The QIP system 1000 can include a source 1060 that provides atomic species to a chamber 1050 having an ion trap 1070 that traps the atomic species once ionized by an optical controller 1020. Optical sources 1030 in the optical controller 1020 may include one or more laser sources that can be used for ionization of the atomic species, control (e.g., phase control) of the atomic ions, and for fluorescence of the atomic ions that can be monitored and tracked by image processing algorithms operating in an imaging system 1040 in the optical controller 1020. The imaging system 1040 can include a high resolution imager (e.g., CCD camera) for monitoring the atomic ions while they are being provided to the ion trap 1070 (e.g., for counting) or after they have been provided to the ion trap 1070 (e.g., for monitoring the atomic ions states). In an aspect, the imaging system 1040 can be implemented separate from the optical controller 1020, however, the use of fluorescence to detect, identify, and label atomic ions using image processing algorithms may need to be coordinated with the optical controller 1020.

The QIP system 1000 may also include an algorithms component 1010 that may operate with other parts of the QIP system 1000 (not shown) to perform quantum algorithms (e.g., QFT, quantum simulations) that make use of the implementations described above. An implementation component 1015 may be used to identify, generate, select, or otherwise determine a particular implementation to be used of a controlled-$Z^a$ gate and/or a Heisenberg interaction. The implementation component 1015 may operate in conjunction with a circuit optimizer, may it be the circuit optimizer or at least a part of the circuit optimizer, and/or may implement aspects or functions of a circuit optimizer. In an aspect, the implementation component 1015 may operate with the algorithms component 1010 to break down code for quantum computations or quantum simulations into computing or gate primitives that can be physically implemented. As such, the algorithms component 1010 may provide instructions to various components of the QIP system 1000 (e.g., to the optical controller 1020) to enable the implementation of quantum circuits, or their equivalents, such as the ones described herein. That is, the algorithms component 1010 may allow for mapping of different computing primitives into physical representations using, for example, the ion trap 1070. It is to be understood that the QIP system 1000, the algorithms component 1010, and/or the implementation component 1015 may operate in a fault-tolerant mode or setting in connection with the implementation of a controlled-$Z^a$ gate and/or a Heisenberg interaction.

As described herein, either or both of the computer device 700 or the QIP system 1000 may be configured as fault-tolerant quantum computing systems. Moreover, while the QIP system 1000 has been described as being an ion-trapped-based system, similar operations/functionality may be achieved with a superconducting-based system.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method for performing a quantum algorithm, comprising: identifying use of a controlled-$Z^a$ gate as part of the quantum algorithm, wherein the quantum algorithm includes a Heisenberg interaction and is based on projecting a real-valued degree of freedom in the Heisenberg interaction onto a controlled $R_z^a$ rotation, and wherein a is a parameter and a $\in[-1, 1]$; implementing the controlled-$Z^a$ gate with an ancilla qubit for a fault-tolerant quantum information processing (QIP) system, wherein the implementation of the controlled-$Z^a$ gate includes multiple elements, and wherein the multiple elements include a single parametrized $Z^a$ gate, only four (4) Hadamard gates, only four (4) T gates, only four (4) $T^\dagger$ gates, and only six (6) controlled-NOT (CNOT) gates; mapping the implementation of the controlled-$Z^a$ gate into a physical representation in the fault-tolerant QIP system; and performing the quantum algorithm based at least in part on the physical representation.

2. The method of claim 1, wherein the quantum algorithm is a quantum Fourier transform (QFT).

3. The method of claim 1, wherein implementing the controlled-$Z^a$ gate for the fault-tolerant QIP system includes identifying that the implementation of the controlled-$Z^a$ gate is without measurement and feedforward.

4. The method of claim 1, wherein:
the fault-tolerant QIP system is a trapped-ion QIP system, and
mapping the implementation of the controlled-$Z^a$ gate includes mapping the implementation of the controlled-$Z^a$ gate using multiple trapped-ion-based qubits in the trapped-ion QIP system.

5. The method of claim 1, wherein:
the fault-tolerant QIP system is a superconducting QIP system, and
mapping the implementation of the controlled-$Z^a$ gate includes mapping the implementation of the controlled-$Z^a$ gate using multiple superconducting-based qubits in the superconducting QIP system.

6. A fault-tolerant quantum information processing (QIP) system for performing a quantum algorithm, comprising: an implementation component configured to: identify use of a controlled-$Z^a$ gate as part of the quantum algorithm, wherein the quantum algorithm includes a Heisenberg interaction and is based on projecting a real-valued degree of freedom in the Heisenberg interaction onto a controlled $R_z^a$ rotation, wherein a is a parameter and a $\in[-1, 1]$, implement the controlled-$Z^a$ gate with an ancilla qubit for the fault-tolerant QIP system, wherein the implementation of the controlled-$Z^a$ gate includes multiple elements, and wherein the multiple elements include a single parametrized $Z^a$ gate, only four (4) Hadamard gates, only four (4) T gates, only four (4) $T^\dagger$ gates, and only six (6) controlled-NOT (CNOT) gates, and map the implementation of the controlled-$Z^a$ gate into a physical representation in the fault-tolerant QIP system map; and an algorithms component configured to perform the quantum algorithm based at least in part on the physical representation.

7. A non-transitory computer-readable medium storing code with instructions executable by a processor for performing a quantum algorithm, wherein the quantum algorithm includes a Heisenberg interaction and is based on projecting a real-valued degree of freedom in the Heisenberg interaction onto a controlled $R_z^a$ rotation, comprising: code for identifying use of a controlled-$Z^a$ gate as part of the quantum algorithm, wherein a is a parameter and a $\in[-1, 1]$; code for implementing the controlled-$Z^a$ gate with an ancilla qubit for a fault-tolerant quantum information processing (QIP) system, wherein the implementation of the controlled-$Z^a$ gate includes multiple elements, and wherein the multiple elements include a single parametrized $Z^a$ gate, only four (4) Hadamard gates, only four (4) T gates, only four (4) $T^\dagger$ gates, and only six (6) controlled-NOT (CNOT) gates; code for mapping the implementation of the controlled-$Z^a$ gate into a physical representation in the fault-tolerant QIP system; and code for performing the quantum algorithm based at least in part on the physical representation.

8. A method for performing a quantum algorithm, comprising: identifying use of a controlled-$Z^a$ gate as part of the quantum algorithm, wherein the quantum algorithm includes a Heisenberg interaction and is based on projecting a real-valued degree of freedom in the Heisenberg interaction onto a controlled $R_z^a$ rotation, wherein a is a parameter and a$\in[-1, 1]$; implementing the controlled-Z" gate with an ancilla qubit for a fault-tolerant quantum information processing (QIP) system, wherein the implementation of the controlled-Z' gate includes multiple elements, and the multiple elements include a single parametrized Z' gate, only two (2) T gates, only two (2) $T^\dagger$ gates only three (3) controlled-NOT (CNOT) gates, and only three (3) Hadamard (H) gates; mapping the implementation of the controlled-Za gate into a physical representation in the fault-tolerant QIP system; and performing the quantum algorithm based at least in part on the physical representation.

9. The method of claim 8, wherein the quantum algorithm is a quantum Fourier transform (QFT).

10. The method of claim 8, wherein implementing the controlled-$Z^a$ gate for the fault-tolerant QIP system includes identifying that the implementation of the controlled-$Z^a$ gate is with measurement and feedforward.

11. The method of claim 8, wherein the multiple elements of the implementation of the controlled-$Z^a$ gate further include:
a single measurement element, and
a single classically-conditioned controlled Pauli-Z gate.

12. The method of claim 8, wherein:
the fault-tolerant QIP system is a trapped-ion QIP system, and
mapping the implementation of the controlled-$Z^a$ gate includes mapping the implementation of the controlled-$Z^a$ gate using multiple trapped-ion-based qubits in the trapped-ion QIP system.

13. The method of claim 8, wherein:
the fault-tolerant QIP system is a superconducting QIP system, and
mapping the implementation of the controlled-$Z^a$ gate includes mapping the implementation of the controlled-$Z^a$ gate using multiple superconducting-based qubits in the superconducting QIP system.

14. A fault-tolerant quantum information processing (QIP) system for performing a quantum algorithm, comprising: an implementation component configured to: identify use of a controlled-$Z^a$ gate as part of the quantum algorithm, wherein the quantum algorithm includes a Heisenberg interaction and is based on projecting a real-valued degree of freedom in the Heisenberg interaction onto a controlled $R_z^a$ rotation, wherein a is a parameter and a∈[−1, 1], implement the controlled-$Z^a$ gate with an ancilla qubit for the fault-tolerant QIP system, wherein the implementation of the controlled-Za gate includes multiple elements, and wherein the multiple elements include a single parametrized $Z^a$ gate, only two (2) T gates, only two (2) T$^†$ gates, only three (3) controlled-NOT (CNOT) gates, and only three (3) Hadamard (H) gates, and map the implementation of the controlled-$Z^a$ gate into a physical representation in the fault-tolerant QIP system; and an algorithms component configured to perform the quantum algorithm based at least in part on the physical representation.

15. A non-transitory computer-readable medium storing code with instructions executable by a processor for performing a quantum algorithm, comprising: code for identifying use of a controlled-$Z^a$ gate as part of the quantum algorithm, wherein the quantum algorithm includes a Heisenberg interaction and is based on projecting a real-valued degree of freedom in the Heisenberg interaction onto a controlled $R_z^a$ rotation, wherein a is a parameter and a†[−1, 1]; code for implementing the controlled-$Z^a$ gate with an ancilla qubit for a fault-tolerant quantum information processing (QIP) system, wherein the implementation of the controlled-$Z^a$ gate includes multiple elements, and wherein the multiple elements include a single parametrized $Z^a$ gate, only two (2) T gates, only two (2) T$^†$ gates, only three (3) controlled-NOT (CNOT) gates, and only three (3) Hadamard (H) gates; code for mapping the controlled-$Z^a$ gate into a physical representation in the fault-tolerant QIP system; and code for performing the quantum algorithm based at least in part on the physical representation.

16. A method for performing a quantum simulation, comprising: identifying use of a Heisenberg interaction as part of the quantum simulation; identifying a controlled-$Z^a$ gate for implementing the Heisenberg interaction by projecting a real-valued degree of freedom in the Heisenberg interaction onto a controlled $R_z^a$ rotation, wherein a is a parameter and a∈[−1, 1]; implementing the Heisenberg interaction for a fault-tolerant quantum information processing (QIP) system, wherein the implementation of the Heisenberg interaction is based on an implementation of the controlled-$Z^a$ gate with an ancilla qubit, and wherein the implementation of the Heisenberg interaction includes a single parametrized $Z^a$ gate, only six (6) Hadamard gates, only four (4) T gates, only four (4) T$^†$ gates, and only eight (8) controlled-NOT (CNOT) gates; mapping the implementation of the Heisenberg interaction into a physical representation in the fault-tolerant QIP system; performing the quantum simulation based at least in part on the physical representation; and providing results from the quantum simulation.

17. The method of claim 16, wherein the quantum simulation is configured for solving a problem associated with a many body localization phenomena.

18. The method of claim 16, wherein implementing the Heisenberg interaction for the fault-tolerant QIP system includes identifying that the implementation of the controlled-$Z^a$ gate is without measurement and feedforward.

19. The method of claim 16, wherein implementing the Heisenberg interaction for the fault-tolerant QIP system includes identifying that the implementation of the controlled-$Z^a$ gate is with measurement and feedforward.

20. The method of claim 16, wherein:
the fault-tolerant QIP system is a trapped-ion QIP system, and
mapping the implementation of the Heisenberg interaction includes mapping the implementation of the Heisenberg interaction using multiple trapped-ion-based qubits in the trapped-ion QIP system.

21. The method of claim 16, wherein:
the fault-tolerant QIP system is a superconducting QIP system, and
mapping the implementation of the Heisenberg interaction includes mapping the implementation of the Heisenberg interaction using multiple superconducting-based qubits in the superconducting QIP system.

22. A fault-tolerant quantum information processing (QIP) system for performing a quantum simulation, comprising: an implementation component configured to: identify use of a Heisenberg interaction as part of the quantum simulation, identify a controlled-$Z^a$ gate for implementing the Heisenberg interaction by projecting a real-valued degree of freedom in the Heisenberg interaction onto a controlled $R_z^a$ rotation, wherein a is a parameter and a∈ [−1, 1], implement the Heisenberg interaction for the fault-tolerant QIP system, wherein the implementation of the Heisenberg interaction is based on an implementation of the controlled-$Z^a$ gate with an ancilla qubit, and wherein the implementation of the Heisenberg interaction includes a single parametrized $Z^a$ gate, only six (6) Hadamard gates, only four (4) T gates, only four (4) T$^†$ gates, and only eight (8) controlled-NOT (CNOT) gates, map the implementation of the Heisenberg interaction into a physical representation in the fault-tolerant QIP system; and an algorithms component configured to: perform the quantum algorithm based at least in part on the physical representation, and provide results from the quantum simulation.

23. A non-transitory computer-readable medium storing code with instructions executable by a processor for performing a quantum simulation, comprising: code for identifying use of a Heisenberg interaction as part of the quantum simulation; code for identifying a controlled-$Z^a$ gate for implementing the Heisenberg interaction by projecting a real-valued degree of freedom in the Heisenberg interaction onto a controlled $R_z^a$ rotation, wherein a is a parameter and a∈[−1, 1]; code for implementing the Heisenberg interaction for a fault-tolerant quantum information processing (QIP) system, wherein the implementation of the Heisenberg interaction is based on an implementation of the controlled-$Z^a$ gate with an ancilla qubit, and wherein the implementation of the Heisenberg interaction includes a single parametrized $Z^a$ gate, only six (6) Hadamard gates, only four (4) T gates, only four (4) T† gates, and only eight (8) controlled-NOT (CNOT) gates; code for mapping the implementation of the Heisenberg interaction into a physical representation in the fault-tolerant QIP system; code for performing the quantum simulation based at least in part on the physical representation; and code for providing results from the quantum simulation.

24. A method for performing a quantum simulation, comprising: identifying use of a Heisenberg interaction as part of the quantum simulation; identifying a controlled-$Z^a$ gate for implementing the Heisenberg interaction by projecting a real-valued degree of freedom in the Heisenberg interaction onto a controlled $R_z^a$ rotation, wherein a is a parameter and a∈[−1, 1]; implementing the Heisenberg interaction for a fault-tolerant quantum information processing (QIP) system, wherein the implementation of the Heisenberg interaction is based on an implementation of the controlled-$Z^a$ gate with an ancilla qubit, and wherein the implementation of the Heisenberg interaction includes a single parametrized $Z^a$ gate, only five (5) Hadamard gates, only two (2) T gates, only two (2) T† gates, and only five (5) controlled-NOT (CNOT) gates; mapping the implementation of the Heisenberg interaction into a physical representation in the fault-tolerant QIP system; performing the quantum simulation based at least in part on the physical representation; and providing results from the quantum simulation.

25. The method of claim 24, wherein the implementation of the Heisenberg interaction further includes:
a single measurement element, and
a single classically-conditioned controlled Pauli-Z gate.

* * * * *